United States Patent
Fujikura

(10) Patent No.: US 8,664,123 B2
(45) Date of Patent: Mar. 4, 2014

(54) METHOD FOR MANUFACTURING NITRIDE SEMICONDUCTOR SUBSTRATE

(75) Inventor: Hajime Fujikura, Mito (JP)

(73) Assignee: Hitachi Cable, Ltd., Tokyo (JP)

( * ) Notice: Subject to any disclaimer, the term of this patent is extended or adjusted under 35 U.S.C. 154(b) by 107 days.

(21) Appl. No.: 13/489,570

(22) Filed: Jun. 6, 2012

(65) Prior Publication Data
US 2013/0023128 A1 Jan. 24, 2013

(30) Foreign Application Priority Data

Jul. 19, 2011 (JP) ................................ 2011-157671

(51) Int. Cl.
*H01L 21/302* (2006.01)
*H01L 21/461* (2006.01)
(52) U.S. Cl.
USPC .................... 438/716; 438/718; 257/E21.218
(58) Field of Classification Search
None
See application file for complete search history.

(56) References Cited

FOREIGN PATENT DOCUMENTS

JP 2007-284283 1/2007

*Primary Examiner* — Nadine G Norton
*Assistant Examiner* — Mahmoud Dahimene
(74) *Attorney, Agent, or Firm* — Fleit Gibbons Gutman Bongini & Bianco PL; Martin Fleit; Paul D. Bianco

(57) ABSTRACT

There is provided a method for manufacturing a nitride semiconductor substrate, comprising: etching and flattening a surface of a nitride semiconductor substrate disposed facing a surface plate, by using the surface plate having a surface composed of any one of Ni, Ti, Cr, W, and Mo or nitride of any one of them, disposing the surface of the surface plate and a flattening surface of a nitride semiconductor substrate proximately so as to be faced each other, and supplying gas containing at least hydrogen and ammonia between the surface of the surface plate and the surface of the nitride semiconductor substrate, wherein the surface plate and the nitride semiconductor substrate facing each other are set in a high temperature state of 900° C. or more.

7 Claims, 1 Drawing Sheet

METHOD FOR MANUFACTURING NITRIDE SEMICONDUCTOR SUBSTRATE

The present application is based on Japanese Patent Application No. 2011-157671, filed on Jul. 19, 2011, the entire contents of which are hereby incorporated by reference.

BACKGROUND OF THE INVENTION

1. Technical Field

The present invention relates to a method for manufacturing a nitride semiconductor substrate for flattening a surface of a nitride semiconductor substrate.

2. Description of the Related Art

Generally, a processing method of flattening a surface of a workpiece such as a semiconductor wafer, includes a mechanical method of polishing a surface of a workpiece using abrasive grains, a polishing fluid (slurry) with abrasive grains dispersed therein, or a polishing cloth with abrasive grains fixed thereto; and a chemical method of etching the surface of the workpiece using a corrosive chemicals, etc., and a physical/chemical method for etching the surface of the workpiece using plasma.

In a case of a nitride semiconductor such as GaN (gallium nitride), Ga surface (Ga polar surface) for forming a device is hard and chemically stable. Therefore, there is no suitable chemical for etching the surface of a GaN substrate (GaN freestanding substrate) to be chemically flat at a sufficient etching speed, and therefore conventionally, the mechanical method or the plasma etching are performed for flattening the GaN substrate. (For example, see patent document 1). According to the mechanical method of patent document 1, when the GaN surface is processed into a mirror surface, diamond abrasive grains and SiC abrasive grains are used, to thereby obtain a surface with further excellent surface grain size, and as a final processing, slurry such as alumina and colloidal silica, etc., are used, to thereby obtain a flat surface.
Patent Document 1
Japanese Patent Laid Open Publication No. 2007-284283

However, in the polishing using the aforementioned mechanical method, mechanical scratch or damage is remained on the surface of the nitride semiconductor substrate such as GaN, and also there is a limit in a flattening/smoothing level of the surface. Further, the plasma etching involves a problem that a large-sized expensive apparatus is required, and the surface of the nitride semiconductor substrate is damaged by plasma.

An object of the present invention is to provide a method for manufacturing a nitride semiconductor substrate capable of manufacturing a nitride semiconductor substrate having a flat surface, without damaging the surface of the nitride semiconductor substrate.

SUMMARY OF THE INVENTION

According to an aspect of the present invention, there is provided a method for manufacturing a nitride semiconductor substrate, comprising:
etching and flattening a surface of a nitride semiconductor substrate facing a surface plate, by using the surface plate having a surface composed of any one of Ni, Ti, Cr, W, and Mo or nitride of any one of them, disposing the surface of the surface plate and a flattening surface of a nitride semiconductor substrate proximately so as to be faced each other, and supplying gas containing at least hydrogen and ammonia between the surface of the surface plate and the surface of the nitride semiconductor substrate, wherein the surface plate and the nitride semiconductor substrate disposed facing each other are set in a high temperature state of 900° C. or more.

DETAILED DESCRIPTION OF THE INVENTION

Embodiments of a method for manufacturing a nitride semiconductor substrate according to the present invention will be described hereafter.
(A Method for Manufacturing a Nitride Semiconductor Substrate According to an Embodiment)

Figure 1A:
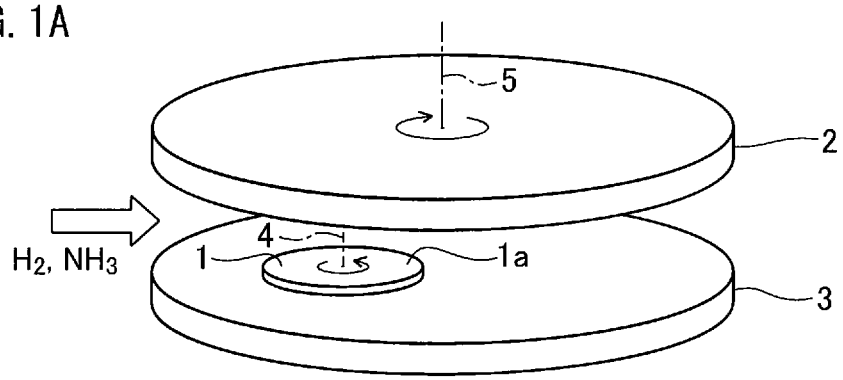
FIG. 1A is a perspective view showing a method for manufacturing a nitride semiconductor substrate according to an embodiment of the present invention.
Figure 1B:
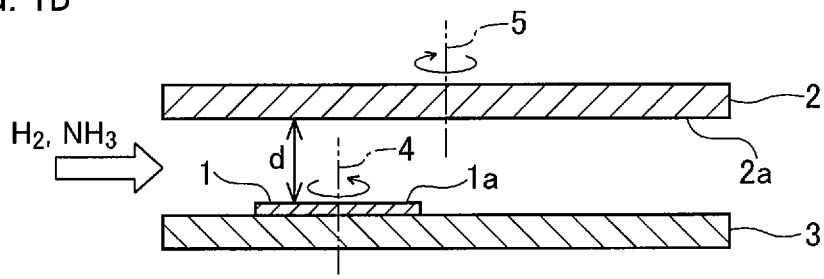
FIG. 1B is a cross-sectional view of FIG. 1A.

FIG. 1A and FIG. 1B describe a method for manufacturing a nitride semiconductor substrate according to an embodiment of the present invention, wherein FIG. 1A is a perspective view, and FIG. 1B is a cross-sectional view.

As shown in FIG. 1A and FIG. 1B, a surface plate 2 is provided above a support base 3 on which a nitride semiconductor substrate 1 is placed, in such a manner as facing the support base 3 in parallel thereto with a prescribed distance held between them. A gas passage for flowing gas for etching the nitride semiconductor substrate 1 is formed by a space between the surface plate 2 and the support base 3 which are facing each other. At least a gas containing hydrogen ($H_2$) and ammonia ($NH_3$) is given as the gas for etching, and further for example a carrier gas such as nitrogen gas ($N_2$) may also be added. In an embodiment shown in FIG. 1A and FIG. 1B, the surface plate 2 and the support base 3 are formed into a disc shape. However, the shape is not limited to the disc shape. It is preferable that the surface plate 2 and the support base 3 keep a stable shape without allowing a deformation, etc., to occur even if they are heated at 900° C. or more, wherein a lower face of the surface plate 2 and an upper face of the support base 3 are formed flat.

The nitride semiconductor substrate 1 is a substrate (freestanding substrate, wafer) composed of III-group nitride semiconductor such as GaN, AlN. The nitride semiconductor substrate 1 is placed on the support base 3, with surface 1a of the nitride semiconductor substrate directed upward to be flattened and smoothened. The flattened surfaces 1a of the nitride semiconductor substrate 1 is usually formed as an III-group polar surface (Ga surface, Al surface, etc.) on which a device is formed. In FIG. 1A and FIG. 1B, one nitride semiconductor substrate 1 is installed on the support base 3. However, a plurality of nitride semiconductor substrates may also be installed thereon.

The surface 2a of the surface plate 2 facing at least the nitride semiconductor substrate 1 and the support base 3, is preferably made of any one of Ni (nickel), Ti (titanium), Cr (chromium), W (tungsten), Mo (molybdenum), or a nitride of the metal of any one of them. All surface plates may be made of the aforementioned materials such as Mo, or a metal film made of Mo, etc., or a metal nitride film made of Mo, etc., may be formed on the surface of a surface plate body made of a material different from Mo, etc. The aforementioned metal and metal nitride are given as a material capable of generating atomic hydrogen by decomposing a hydrogen gas by a catalytic action as will be described later, and the other material may also be acceptable if it has the catalytic action. The surface 2a of the surface plate 2 has preferably a surface roughness RMS (a root mean square roughness) of 10 μm or less, and the surface roughness RMS is further preferably 100 nm or less.

One of or both of the nitride semiconductor substrates 1 and the surface plate 2 are rotary-driven while facing surfaces 1a, 2a, each other. During such a rotary drive as well, the surface 2a of the surface plate 2 has a width of always covering an upper part of the surface 1a of the nitride semiconductor substrate 1. In the embodiments shown in FIG. 1A and FIG. 1B, both of the circular nitride semiconductor substrate 1 and the surface plate 2 are rotated mutually in an opposite direction around the central axes 4, 5 of them. Further, when the surface 2a of the surface plate 2 is projected on a flat surface including the surface 1a of the nitride semiconductor substrate 1, the central axis (rotation center) 5 of the surface plate 2 is disposed so as not to exist in an area within the surface 1a of the nitride semiconductor substrate. Further, the surface plate 2 or the support base 3 are configured to be elevated/lowered vertically, so that a distance d between the surface 1a of the nitride semiconductor substrate on the support base 3 and the surface 2a of the surface plate 2 can be adjusted.

In the step of flattening the surface 1a of the nitride semiconductor substrate 1 by etching, the distance d between the surface 1a of the nitride semiconductor substrate 1 and the surface 2a of the surface plate 2 is disposed proximately in a range of 2 mm to 20 mm. Then, the surface plate 2 and the nitride semiconductor substrate 1 are set in a state of being heated to 900° C. or more by a heater (not shown), etc., and the gas containing at least hydrogen and ammonia is supplied between the surface plate 2 and the support base 3.

The gas supplied between the surface plate 2 and the support base 3 flows along the surface 2a of the surface plate 2 and the surface 1a of the nitride semiconductor substrate 1. At this time, hydrogen gas is brought into contact with the surface 2a of the surface plate 2 which is set in a high temperature state, and the atomic hydrogen with high reactivity is generated on the surface 2a of the surface plate 2, by the catalytic reaction of Mo, etc., which are materials forming the surface 2a of the surface plate 2. It is conceivable that the surface 1a of the nitride semiconductor substrate 1 is subjected to etching mainly by the atomic hydrogen. Namely, the atomic hydrogen generated on the surface 1a of the nitride semiconductor substrate 1 is diffused to the nitride semiconductor substrate 1 side, and reaches the surface 1a of the nitride semiconductor substrate, to thereby apply etching to the surface 1a of the nitride semiconductor substrate 1. Specifically, in a case that the nitride semiconductor substrate 1 is a GaN substrate, GaN crystal on the surface is decomposed into $GaH_3$ (gallane) and $NH_3$ (ammonia) and is subjected to etching.

The atomic hydrogen is unstable because it is reacted and disappears in a short period of time, thus rapidly attenuating an etching action by the atomic hydrogen as it is away from the surface 2a of the surface plate 2. Therefore, etching is applied to the nitride semiconductor substrate 1 only which exists inside of a certain distance from the surface 2a of the surface plate 2, and when the distance between the surface plate 2 and the nitride semiconductor substrate 1 is long, etching is not applied to the nitride semiconductor substrate 1. Accordingly, the space between the surface plate 2 and the nitride semiconductor substrate 1 is set proximately in a range of 2 mm to 20 mm for example.

The atomic hydrogen diffused from the surface plate 2 reaches the surface 1a of the nitride semiconductor substrate 1 which is close to the surface plate 2, with a large quantity. Namely, mainly the atomic hydrogen reaches protrusions of the surface 1a of the nitride semiconductor substrate 1 facing the surface plate 2 side with large quantity, in the surface 1a of the nitride semiconductor substrate 1 having unevenness. Therefore, etching is more applied to the protrusions than recesses on the surface 1a of the nitride semiconductor substrate 1, thus promoting the flattening/smoothening of the surface 1a. Particularly, when the distance d between the surface 2a of the surface plate 2 and the surface 1a of the nitride semiconductor substrate 1 is suitably set, etching can be selectively applied to top sides of the protrusions of the surface 1a facing the surface plate 2 side, thus further promoting the flattening/smoothening of the surface 1a.

Even if the surface 1a of the nitride semiconductor substrate 1 is removed by etching, the surface plate 2 and the nitride semiconductor substrate 1 are preferably approached to each other, in such a way that the distance d is constant between the surface 2a of the surface plate and the surface 1a of the nitride semiconductor substrate 1. Thus, suitable smoothening/flattening of the surface 1a of the nitride semiconductor substrate is achieved, and a constant etching speed can be maintained.

Ammonia gas is flowed in addition to hydrogen gas during etching, for suppressing a thermal decomposition of the nitride semiconductor substrate 1. Thermal decomposition occurs in the nitride semiconductor substrate 1 heated to 900° C. or more, and nitrogen molecules come out of the surface 1a of the nitride semiconductor substrate 1. Such a thermal decomposition is likely to occur particularly in a weak crystal part, thus forming random unevenness on the surface 1a of the substrate 1. By flowing the ammonia gas, ammonia is decomposed under high temperature of 900° C. or more to thereby generate atomic nitrogen, and the atomic nitrogen thus generated is supplied to the surface 1a of the substrate 1. Therefore, by flowing the ammonia gas, the thermal decomposition on the surface 1a of the nitride semiconductor substrate 1 can be suppressed and reduced, and a state change of the surface 1a by thermal decomposition can be suppressed.

If etching is applied to the nitride semiconductor substrate 1 in a fixed state without rotating the surface plate 2 and the nitride semiconductor substrate 1, a surface state and a surface shape of the surface 2a of the surface plate 2 are transferred to the surface 1a of the nitride semiconductor substrate 1. If the surface 2a of the surface plate 2 is flat, the flat shape is reflected on the surface 1a of the nitride semiconductor substrate 1. When the surface 2a of the surface plate 2 is not sufficiently flat, as described above one of or both of the nitride semiconductor substrate 1 and the surface plate 2 are preferably rotated. By this rotation, the smoothening/flattening of the surface 1a of the nitride semiconductor substrate 1 is achieved in an appearance of averaged unevenness/surface roughness on the surface 2a of the surface plate 2. The smoothening/flattening of the surface 1a of the nitride semiconductor substrate 1 is more promoted in a case of rotating both of the nitride semiconductor substrate 1 and the surface plate 2, than in a case of rotating only one of them.

When the surface 2a of the surface plate 2 is not flat in an atomic level, both of the nitride semiconductor substrate 1 and the surface plate 2 are rotated, and the surface 1a of the nitride semiconductor substrate 1 which is flat in the atomic level, can be obtained only by deviating rotation centers (central axes) 4, 5 of the nitride semiconductor substrate 1 and the surface plate 2. Further, when both of the surface plate 2 and the nitride semiconductor substrate 1 are rotated, the rotation center (central axis) 5 of the surface plate 2 is preferably set outside of the nitride semiconductor substrate 1 when the surface 2a of the surface plate 2 is projected on a flat surface including the surface 1a of the nitride semiconductor substrate 1. If the rotation center of the surface plate 2 exists within the surface 1a of the nitride semiconductor substrate 1, averaging of the surface roughness, etc., of the surface 2a of the surface plate 2a by rotation is insufficient on the surface 1a of the nitride semiconductor substrate 1 facing the rotation center and near the rotation center of the surface plate 2. However, if the rotation center of the surface plate 2 exists outside the surface 1a of the nitride semiconductor substrate 1, uniform in-surface flatness on the surface la of the nitride semiconductor substrate 1 can be achieved.

Figure 2:
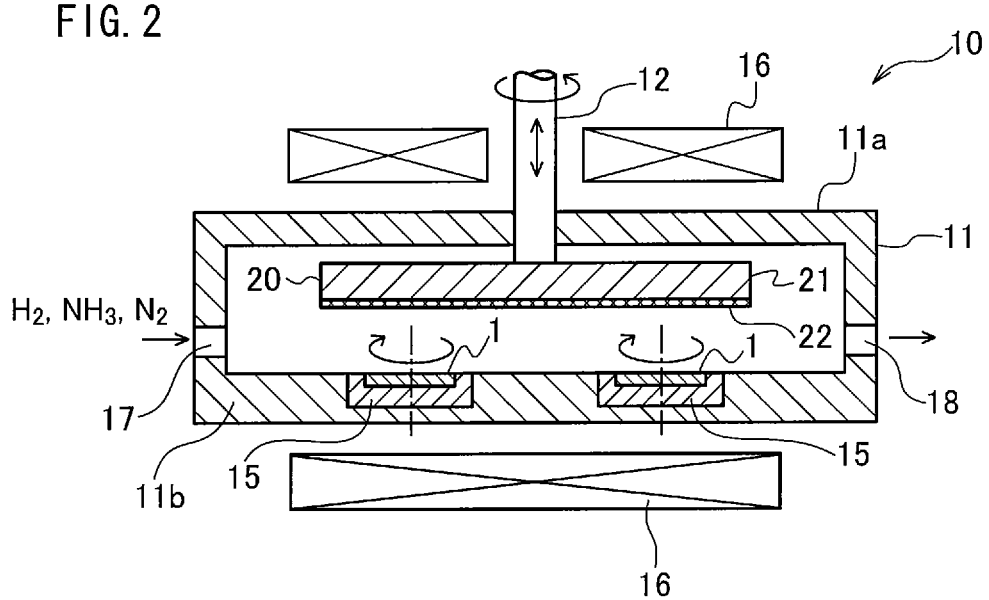
FIG. 2 is a cross-sectional view showing a structure of an etching device configured to flatten a surface of a nitride semiconductor substrate using a method for manufacturing a nitride semiconductor substrate according to other embodiment of the present invention.

In a case of the etching using the atomic hydrogen, the surface 1a of the nitride semiconductor substrate 1 can be flattened at a sufficient etching speed, even if an etching surface is hard and chemically stable like the Ga surface. In the present invention the etching speed of 1 µm/hour or more can be realized, and productivity of the nitride semiconductor substrate can be improved. Further, the surface of the nitride semiconductor substrate is neither scratched nor damaged, like the conventional mechanical method and plasma etching. Therefore, the nitride semiconductor substrate (nitride semiconductor freestanding substrate) after etching according to the present invention, can be used as it is for fabricating a device such as a light emitting element, not requiring a process of removing a damaged surface portion. Further, etching can be performed only by supplying gas containing at least hydrogen and ammonia between the surface plate and the nitride semiconductor disposed proximately in a high temperature state. Therefore, flattening of the surface of the nitride semiconductor substrate can be realized by a simple small-sized etching device as shown in FIG. 2.

Note that in this embodiment, as shown in FIG. 1A and FIG. 1B, the nitride semiconductor substrate 1 is disposed in a lower part and the surface plate 2 is disposed in an upper part. However, it is also acceptable to invert the nitride semiconductor substrate 1 and the surface plate 2, in such a way that the surface plate 2 is disposed in the lower part and the nitride semiconductor substrate 1 is disposed in the upper part with flattened lower surface 1a directed downward. Further, the whole body of the surface plate and the nitride semiconductor substrate may be disposed obliquely, provided that the surface of the surface plate and the surface of the nitride semiconductor substrate are faced each other.

(Method for Manufacturing a Nitride Semiconductor Substrate According to Other Embodiment)

A method for manufacturing a nitride semiconductor substrate according to other embodiment of the present invention will be described next. FIG. 2 shows an etching device using the method for manufacturing a nitride semiconductor substrate according to this embodiment. An etching device 10 of FIG. 2 is a device of etching and flattening a plurality of nitride semiconductor substrates 1 at once.

As shown in FIG. 2, the etching device 10 includes a vessel 11 in which the nitride semiconductor substrate 1 and a surface plate 20 are installed. The vessel 11 is a cylindrical air-tightly closed vessel having an upper wall 11a and a bottom wall 11b, and is made of quartz glass, etc. The surface plate 20 is horizontally disposed in the upper part in the vessel 11, and a drive shaft 12 is connected to a central portion on an upper surface of the surface plate 20 so as to penetrate the upper wall 11a of the vessel 11. The drive shaft 12 is rotatably and elevatably provided by a rotation mechanism and an elevation mechanism not shown. The surface plate 20 of this embodiment is formed by a surface plate body 21 which is composed of a disc-shaped glass substrate, a ceramic substrate, or a metal substrate, etc., and a metal film 22 made of Mo (molybdenum) which is formed on the surface (main surface) of a lower side of the surface plate body 21. The metal film 22 may be formed on the surface plate body 21 by sputtering for example. Note that the material of the metal film 22 is not limited to Mo, and may be Ni (nickel), Ti (titanium), Cr (chromium), and W (tungsten), etc.

A plurality of nitride semiconductor substrates 1 are disposed along a circumferential direction of the surface plate 20 so as to face the surface plate 20, on the bottom wall 11b side of the vessel 11. The plurality of nitride semiconductor substrates 1 are disposed on the bottom wall 11b respectively via a holder 15. The nitride semiconductor substrate 1 is received in a recess portion in the upper part of the holder 15, and is held by the holder 15 in a horizontal state. Each holder 15 is rotatably provided by the rotation mechanism not shown, so that the nitride semiconductor substrate 1 is rotated together with the holder 15. The holder 15 is preferably made of quartz, SiC (silicon carbide), carbon of SiC coat, and aluminum oxide, etc.

The surface plate 20 and a heater 16 for heating the nitride semiconductor substrate 1 are provided in the upper part of the upper wall 11a and in the lower part of the bottom wall 11b, outside of the vessel 11. Further, a gas supply port 17 for supplying gas for etching, and a gas discharge port 18 for exhausting the gas after etching to outside of the vessel 11, are provided on the side wall of the vessel 11.

Flattening of the nitride semiconductor substrate 1 by etching using the etching device 10 of FIG. 2 will be described.

A plurality of nitride semiconductor substrates 1 are installed in each holder 15, and the drive shaft 12 is elevated/lowered to determine a position (initial position) of the surface plate 20, so that a prescribed distance (for example, 2 mm to 20 mm) is formed between the metal film 22 on the lower surface of the surface plate 20 and the surface of the nitride semiconductor substrate 1. The surface plate 20 and the nitride semiconductor substrate 1 held by the holder 15 are respectively rotated at a prescribed rotation speed by the rotation mechanism not shown, to thereby heat the surface plate 20 and the nitride semiconductor substrate 1 to a prescribed temperature by the heater 16. A heating temperature of the surface plate 20 and the nitride semiconductor substrate 1 is preferably set in a range of 900° C. to 1100° C. The gas for etching is supplied from the gas supply port 20 into the vessel 11 which is heated in a high temperature state. The gas supplied from the gas supply port 17 flows through the space between the surface plate 20 and the bottom wall 11b on which the nitride semiconductor substrate 1 is disposed, and is discharged to outside of the vessel 11 from the gas discharge port 18.

In this embodiment, nitrogen gas is used as a carrier gas, in addition to the hydrogen gas and the ammonia gas. Regarding the gas supplied from the gas supply port 17, for example, total flow rate of the gas is set to 10 slm, and out of the total flow rate, the flow rate of the hydrogen gas is 1 to 3 slm, the flow rate of the ammonia gas is 1 slm, and nitrogen gas is used as the remaining gas. Further, a pressure in the vessel 11 is set to 500 Torr to 800 Torr, and in this state, etching is carried out.

The hydrogen gas in the gas supplied from the gas supply port 17 is brought into contact with the surface of the metal film 22 of the surface plate 20, thus generating the atomic hydrogen by the catalytic reaction of the metal film 22, and the atomic hydrogen reaches the surface of the nitride semiconductor substrate 1, to thereby apply etching to the substrate surface. As the etching process is progressed on the substrate surface, the surface plate 20 may be moved by lowering the drive shaft 12 as needed. As described above, the ammonia gas suppresses the thermal decomposition of the nitride semiconductor substrate 1. In this embodiment, both of the nitride semiconductor substrate 1 and the surface plate 2 are rotated, and since a projection of the rotation center of the surface plate 2 is outside the area of the nitride semiconductor substrate 1, the surface of the nitride semiconductor substrate 1 can be made flat by etching, and in-surface uniformity of the flatness on the substrate surface can be realized. Further, a plurality of nitride semiconductor substrates can be flattened at once, thus realizing high productivity.

Note that in the etching device 10 shown in FIG. 2, the surface plate 20 can be elevated and lowered by the drive shaft 12. However, the nitride semiconductor substrate 1 side may also be configured to be elevated and lowered. Further, in the aforementioned etching device 10, gas flows substantially in one direction through the vessel 11 from the gas supply port 17 at one side of the side wall of the vessel to the gas discharge port 18 at the other side. However, the gas for etching may also be introduced from the center of the bottom wall 11b positioned inside of the plurality of nitride semiconductor substrates 1, and the introduced gas may flow radially from the center of the gas passage formed between the surface plate 20 and the bottom wall 11b.

What is claimed is:

1. A method for manufacturing a nitride semiconductor substrate, comprising:

etching and flattening a surface of a nitride semiconductor substrate facing a surface plate, by using the surface plate having a surface composed of any one of Ni, Ti, Cr, W, and Mo or nitride of any one of them, disposing the surface of the surface plate and a flattening surface of a nitride semiconductor substrate proximately so as to be faced each other, and supplying gas containing at least hydrogen and ammonia between the surface of the surface plate and the surface of the nitride semiconductor substrate, wherein the surface plate and the nitride semiconductor substrate facing each other are set in a high temperature state of 900° C. or more.

2. The method for manufacturing a nitride semiconductor substrate according to claim 1, wherein a distance between the surface of the surface plate and the surface of the nitride semiconductor substrate is in a range of 2 mm to 20 mm.

3. The method for manufacturing a nitride semiconductor substrate according to claim 1, wherein the surface of the surface plate facing the nitride semiconductor substrate has a surface roughness RMS of 10 μm or less.

4. The method for manufacturing a nitride semiconductor substrate according to claim 1, wherein an etching speed for etching the surface of the nitride semiconductor substrate in the step of etching and flattening the surface of the nitride semiconductor substrate, is 1 μm/hour or more.

5. The method for manufacturing a nitride semiconductor substrate according to claim 1, wherein the surface plate and the nitride semiconductor substrate are approached to each other, so that a distance between the surface of the surface plate and the surface of the nitride semiconductor substrate is constant, even if the surface of the nitride semiconductor substrate is removed by etching.

6. The method for manufacturing a nitride semiconductor substrate according to claim 1, wherein one of or both of the surface plate and the nitride semiconductor substrate are rotated, with their surfaces faced each other.

7. The method for manufacturing a nitride semiconductor substrate according to claim 1, wherein when the surface of the surface plate is projected on a flat surface including the surface of the nitride semiconductor substrate while rotating both of the surface plate and the nitride semiconductor substrate with their surfaces facing each other, a rotation center of the surface plate does not exist in an area of the surface of the nitride semiconductor substrate.

\* \* \* \* \*